United States Patent
Moon et al.

(10) Patent No.: US 11,437,113 B2
(45) Date of Patent: Sep. 6, 2022

(54) MEMORY SYSTEM

(71) Applicant: SK hynix Inc., Gyeonggi-do (KR)

(72) Inventors: Min Hwan Moon, Gyeonggi-do (KR); Chung Un Na, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 155 days.

(21) Appl. No.: 16/876,407

(22) Filed: May 18, 2020

(65) Prior Publication Data

US 2021/0125679 A1   Apr. 29, 2021

(30) Foreign Application Priority Data

Oct. 23, 2019  (KR) .................. 10-2019-0132520

(51) Int. Cl.
*G11C 29/38*   (2006.01)
*G06F 12/0804*   (2016.01)

(52) U.S. Cl.
CPC .......... *G11C 29/38* (2013.01); *G06F 12/0804* (2013.01); *G06F 2212/1032* (2013.01)

(58) Field of Classification Search
CPC ....... G11C 29/38; G11C 29/021; G11C 29/50; G11C 29/50012; G11C 5/005; G11C 29/12; G11C 16/10; G11C 16/30; G06F 12/0804; G06F 2212/1032; G06F 3/0644; G06F 3/0611; G06F 3/0629; G06F 3/0647; G06F 3/0604; G06F 3/0614; G06F 12/0238
USPC ........................................ 714/718
See application file for complete search history.

(56) References Cited

U.S. PATENT DOCUMENTS

2019/0065114 A1* 2/2019 Inoue ................ G11C 7/22
2019/0163628 A1* 5/2019 Wang ................ G06F 12/0804
2020/0327055 A1* 10/2020 Mao .................. G06F 11/1068

FOREIGN PATENT DOCUMENTS

KR    10-1701361   2/2017

* cited by examiner

*Primary Examiner* — James C Kerveros
(74) *Attorney, Agent, or Firm* — IP&T Group LLP (57) ABSTRACT

A memory system includes a storage medium including a target memory region having a plurality of memory units; and a controller configured to store data into one or more target memory units, each of which is estimated to take less time to perform a write operation thereon than any of the other memory units among the plurality of memory units, when performing a memory dump operation due to a sudden power off.

13 Claims, 9 Drawing Sheets

MEMORY SYSTEM

CROSS-REFERENCE TO RELATED APPLICATION

The present application claims priority under 35 U.S.C. § 119(a) to Korean application number 10-2019-0132520, filed on Oct. 23, 2019, in the Korean Intellectual Property Office, which is incorporated herein by reference in its entirety.

BACKGROUND

1. Technical Field

Various embodiments generally relate to a memory system, and more particularly, to a memory system including a nonvolatile memory device.

2. Related Art

A memory system may be configured to store, in response to a write request from a host device, data provided from the host device. Also, the memory system may be configured to provide, in response to a read request from the host device, data stored therein to the host device. The host device may be an electronic device capable of processing data and may include a computer, a digital camera, a mobile phone and so forth. The memory system may be provided within the host device or may be a separate component which is coupled to the host device for operation.

SUMMARY

Various embodiments of the present disclosure provides a memory system capable of effectively controlling a memory dump operation.

In accordance with an embodiment of the present disclosure, a memory system may include: a storage medium including a target memory region having a plurality of memory units; and a controller configured to store data into one or more target memory units, each of which is estimated to take less time to perform a write operation thereon than any of the other memory units among the plurality of memory units, when performing a memory dump operation due to a sudden power off.

In accordance with an embodiment of the present disclosure, a memory system may include: a storage medium including a target memory region having a plurality of memory units; and a controller configured to select, based on a table, a target memory unit set including target memory units among memory unit sets and perform a memory dump operation by utilizing the target memory unit set, wherein the table has information of the memory unit sets, into which the plurality of memory units are grouped according to an amount of time required to perform a write operation on each of the memory units.

In accordance with an embodiment of the present disclosure, a memory system may include: a storage medium including a target memory region having a plurality of memory units; and a controller configured to perform, when a sudden power off occurs, a memory dump operation on a target memory unit set, into which memory units are grouped among the plurality of memory units according to an amount of time required to perform a write operation on each of the memory units.

In accordance with an embodiment of the present disclosure, a memory system may include: a memory device including plural memory regions each having plural memory units of respective indexes indicating memory units of respective offsets within the individual memory regions; and a controller suitable for controlling the memory device to perform a memory dump operation on one or more target memory units, which are selected on a basis of target-memory-unit information within a selected one of the memory regions, wherein the target-memory-unit information includes a list of the indexes arranged in an ascending order of amounts of time consumed for write operations respectively on the memory units within a test memory region selected from the memory regions.

In accordance with an embodiment of the present disclosure, the memory system may effectively control the memory dump operation.

BRIEF DESCRIPTION OF THE DRAWINGS

Features, aspects and embodiments are described in conjunction with the attached drawings, in which.

DETAILED DESCRIPTION

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art.

The drawings are not necessarily to scale and, in some instances, proportions may be exaggerated in order to clearly illustrate features of the embodiments. The terminology used herein is for the purpose of describing particular embodiments only and is not intended to be limiting of the invention.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, various embodiments of the present disclosure are described below with reference to the accompanying drawings.

Figure 1:
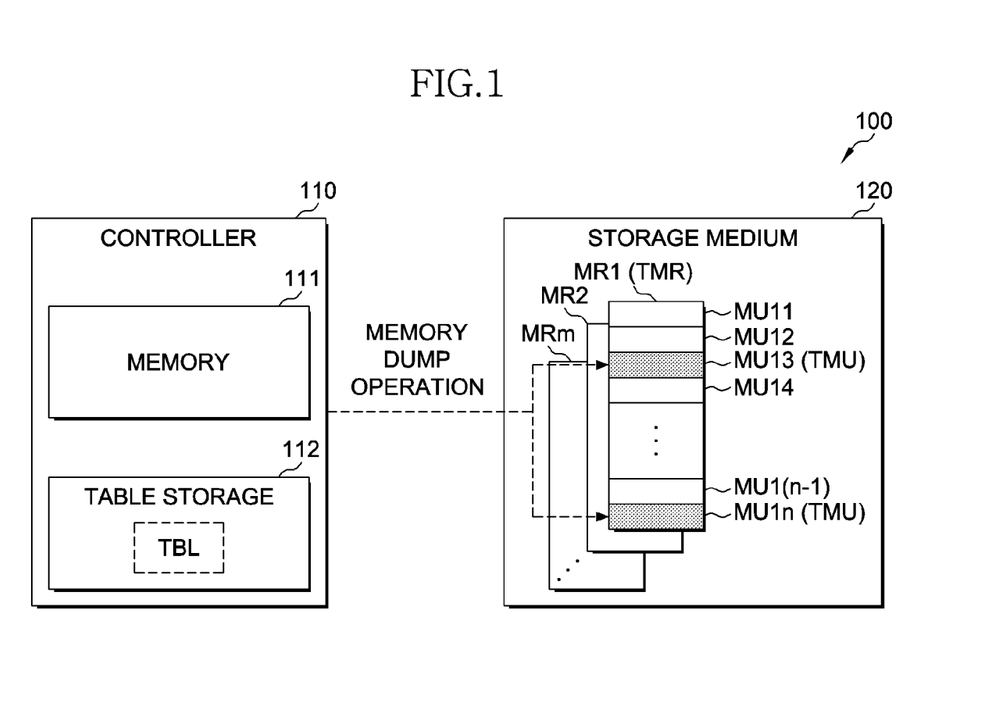
FIG. 1 is a diagram illustrating a configuration of a memory system in accordance with an embodiment of the present disclosure.

FIG. 1 is a diagram illustrating a configuration of a memory system 100 in accordance with an embodiment of the present disclosure.

The memory system 100 may be configured to store, in response to a write request from an external device, data provided from the external device. Also, the memory system 100 may be configured to provide, in response to a read request from the external device, data stored therein to the external device.

The memory system 100 may include a personal computer memory card international association (PCMCIA) card, a compact flash (CF) card, a smart card, a memory stick, a multimedia card in the forms of MMC, eMMC, RS-MMC and micro-MMC, a secure digital card in the forms of SD, mini-SD and micro-SD, a universal flash storage (UFS) device, a solid state drive (SSD), or the like.

The memory system 100 may include a controller 110 and a storage medium 120.

The controller 110 may control general operation of the memory system 100. The controller 110 may control the storage medium 120 in order to perform a foreground operation in response to a request from the external device. The foreground operation may include an operation of writing data in the storage medium 120 and reading data from the storage medium 120 in response to a request (e.g., a write request or a read request) from the external device.

The controller 110 may control the storage medium 120 in order to perform a background operation internally necessary and independent of the external device. The background operation may include a wear leveling operation, a garbage collection operation, an erase operation, a read reclaim operation, a refresh operation and a restoring operation on the storage medium 120. Like the foreground operation, the background operation may include an operation of writing data in the storage medium 120 and reading data from the storage medium 120.

The controller 110 may perform a memory dump operation on a memory 111 when a sudden power off occurs that stops supply of power to the memory system 100. The controller 110 may perform a memory dump operation by using one or more target memory units TMU among memory units MU11 to MU1$n$ included in a target memory region TMR within the storage medium 120. The controller 110 may select, within the target memory region TMR, target memory unit(s) TMU for a memory dump operation by referring to a table TBL stored in a table storage 112. FIG. 1 illustrates two target memory units, although the present invention is not limited to any specific number of target memory units; any suitable number may be employed consistent with teachings herein.

The controller 110 may perform a memory dump operation by storing data, program, operation information, and the like, which are stored in the memory 111, into target memory units TMU. When a sudden power off occurs, stopping the supply of power to the memory system 100, the controller 110 may perform a memory dump operation by using power of a reserved power supply (not illustrated) of the memory system 100. Through a memory dump operation, important data and information may be stored in the storage medium 120 and may be restored.

Therefore, prompt completion of a memory dump operation may drastically improve performance of the memory system 100. Further, small variation of durations of memory dump operations (i.e., even durations among memory dump operations) may lead to smooth control on a memory dump operation, which may cause improvement of the performance of the memory system 100.

For effective memory dump operation, the controller 110 may use, as target memory units TMUs, memory units (e.g., memory units MU13 and MU1$n$ as illustrated in FIG. 1), on which the amount of time required to perform a write operation is estimated to be less than remaining memory units among the memory units MU11 to MU1$n$ included in the target memory region TMR. The controller 110 may select such target memory units TMU among the memory units MU11 to MU1$n$ based on the table TBL.

The table TBL may have information on one or more test memory units, among test memory units, each of which is able to perform a write operation in a relatively short amount of time. The information on the one or more test memory units may be indexes of the one or more test memory units. The controller 110 may select one or more target memory units TMU, among the memory units MU11 to MU1$n$, each of which has the same index as a test memory unit in the table TBL.

Test memory units may be from any of the test memory region among memory regions MR1 to MRm included in the storage medium 120. As to the amount of time required to perform a write operation, each of the test memory units may have the same or similar characteristic as a memory unit of the same index among memory units MU11 to MU1$n$ within the individual memory regions MR1 to MRm. Therefore, even when the table TBL is generated on a basis of certain test memory units, the controller 110 may select, based on the table TBL, target memory units from the memory units MU11 to MU1$n$ of the memory regions MR1 to MRm.

After a memory dump operation by using the target memory region TMR, the controller 110 may perform a subsequent memory dump operation by selecting another target memory region TMR among other memory regions MR2 to MRm included in the storage medium 120. That is, the controller 110 may select, based on the indexes in the table TBL, new target memory units TMU within a new target memory region TMR among the plurality of memory regions MR1 to MRm included in the storage medium 120 at each memory dump operation. Such operation method of the controller 110 is described with reference to FIGS. 4 and 5.

In accordance with an embodiment of the present disclosure, the controller 110 may select a target memory unit set including target memory units TMU among the memory units MU11 to MU1n based on the table TBL and may perform a memory dump operation by using the target memory unit set. The table TBL may have information on memory unit sets, in each of which one or more memory units are grouped among the memory units MU11 to MU1n. The table TBL may have, as the information on the memory unit sets, index sets respectively corresponding to the memory unit sets. Each of the index sets may include the indexes of test memory units, which are different from other index sets.

The index sets may be generated by a set method. In accordance with an embodiment of the present disclosure, the method of generating the index sets may include sequentially generating, based on the amount of time required to perform a write operation on each of the test memory units, the index sets each having a first number of the indexes of test memory units in an ascending order of the amount of time required to perform a write operation thereon and a second number of the indexes of test memory units in a descending order of the amount of time required to perform a write operation thereon. That is, the method of generating the index sets may include: arranging the indexes of the plurality of test memory units in an ascending order of the amount of time required to perform a write operation on each of the test memory units; and sequentially generating the index sets such that each of the index sets sequentially includes the first number of the indexes selected from a top and the second number of the indexes selected from a bottom, among the arranged indexes. Each of the first number and the second number may be a half of a number of dumps or an integer closest to the half. The number of dumps may be a number of memory units required for a single memory dump operation.

The index sets included in the table TBL may be generated such that a total amount of time required to perform write operations on the test memory units corresponding to any one among the index sets may be the same as one another or may be similar to one another. Such method of generating the index sets will be described in detail with reference to FIG. 6A.

The controller 110 may select, as target memory units TMU, memory units (e.g., the memory units MU13 and MU1n) of the indexes included in a target index set among the index sets included in the table TBL. Then, the controller 110 may utilize the target memory region TMR until the target memory region TMR is full of dumped data by sequentially selecting, as the target index set, one among the index sets included in the table TBL at each memory dump operation. Such operation of the controller 110 will be described in detail with reference to FIG. 7.

In accordance with an embodiment of the present disclosure, the method of generating the index sets may include arranging the indexes of the plurality of test memory units in an ascending order of the amount of time required to perform a write operation on each of the test memory units; dividing the arranged indexes into index groups with reference to one or more points between the arranged indexes, an increment of the amount of time required to perform write operations on the test memory units at each of the point being greater than a threshold; calculating a group ratio of each of the index groups based on a total number of the indexes included in each index group; calculating an assigned number for each index group based on a number of dumps and the group ratio; sequentially generating sub-index sets for the respective index groups, each sub-index set including the indexes as many as the assigned number for the corresponding index group; and combining the sub-index sets of the same order within the respective index groups into an index set of a corresponding order.

Each of the sub-index sets sequentially generated within each index group may sequentially include a first number of the indexes selected from a top and a second number of the indexes of test memory units selected from a bottom, among the indexes arranged in the ascending order of the amount of time required to perform a write operation on a corresponding test memory unit within a corresponding index group. Each of the first number and the second number may be a half of the assigned number or an integer closest to the half. Such method of generating the index sets will be described in detail with reference to FIG. 8.

In accordance with an embodiment of the present disclosure, the controller 110 may perform a memory dump operation on the target memory units TMU as a foreground operation or a background operation.

The controller 110 may include the memory 111 and a table storage 112.

The memory 111 may be a working memory configured to store various program codes and software that are driven by the controller 110 to operate the memory system 100. The memory 111 may be a buffer memory configured to temporarily store data to be transferred between an external device and the storage medium 120. The memory 111 may be a cache memory configured to cached data.

The memory 111 may include one or more volatile memory devices. The memory 111 may include a Dynamic Random Access Memory (DRAM) or a Static Random Access Memory (SRAM).

The memory 111 may include one or more nonvolatile memory devices. The memory 111 may include a flash memory such as a NAND flash or a NOR flash, a Ferroelectrics Random Access Memory (FeRAM), a Phase-Change Random Access Memory (PCRAM), a Magnetoresistive Random Access Memory (MRAM), or a Resistive Random Access Memory (ReRAM).

As illustrated in FIG. 1, the memory 111 may be provided within the controller 110. In an embodiment, the memory 111 may be provided outside the controller 110.

The table storage 112 may be configured to store the table TBL. The table TBL may be generated by an external device according to the method of generating the table TBL as described above and may be stored in the table storage 112. In an embodiment, the table TBL may be generated by the controller 110 and may be stored in the table storage 112 during the operation of the memory system 100.

In an embodiment, the table TBL may be stored in the storage medium 120 and may be loaded from the storage medium 120 onto the table storage 112 to be utilized when required during the operation of the memory system 100.

The table storage 112 may be configured as a memory different from the memory 111, as illustrated in FIG. 1. In an embodiment, the table storage 112 may be included in the memory 111.

According to the control of the controller 110, the storage medium 120 may store data provided from the controller 110, may read data stored therein and may provide the read data to the controller 110. The storage medium 120 may include the plurality of memory regions MR1 to MRm configured to store data. As illustrated, the memory region MR1 includes the plurality of memory units MU11 to MU1n. Similarly, each of the memory regions MR2 to MRm may also include a plurality of memory units.

The storage medium 120 may include one or more nonvolatile memory devices. The storage medium 120 may include a flash memory such as a NAND flash or a NOR flash, a Ferroelectrics Random Access Memory (FeRAM), a Phase-Change Random Access Memory (PCRAM), a Magneto-resistive Random Access Memory (MRAM), or a Resistive Random Access Memory (ReRAM).

Figure 2:
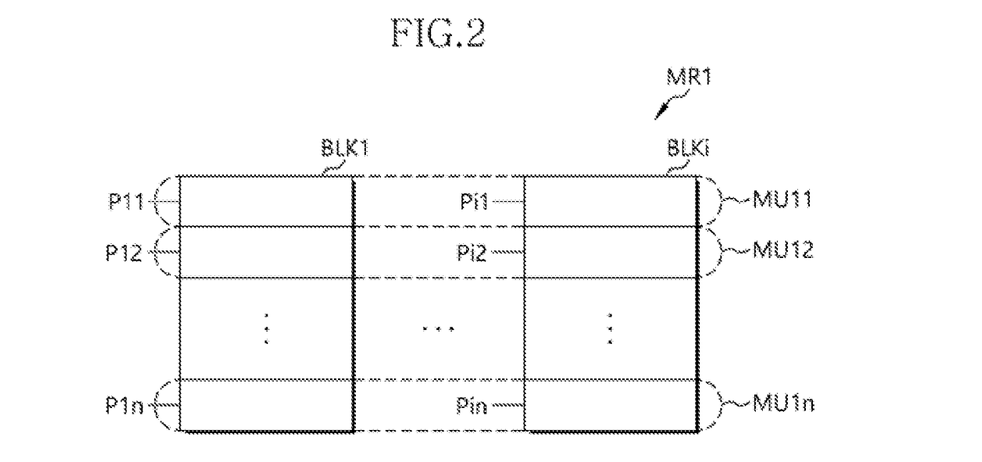
FIG. 2 is a diagram illustrating a structure of a memory region illustrated in FIG. 1 in accordance with an embodiment of the present disclosure.

FIG. 2 is a diagram illustrating a structure of the memory region MR1 illustrated in FIG. 1 in accordance with an embodiment of the present disclosure. Each of the remaining memory regions MR2 to MRm may have a structure the same as that of MR1.

Referring to FIG. 2, the memory region MR1 may include a plurality of memory blocks BLK1 to BLKi.

The memory blocks BLK1 to BLKi may be distributed within one or more nonvolatile memory devices included in the storage medium 120.

Each of the memory blocks BLK1 to BLKi may include a plurality of pages. For example, the memory block BLK1 may include a plurality of pages P11 to P1n and the memory block BLKi may include a plurality of pages Pi1 to Pin.

In an embodiment, the page may be a unit, on which a nonvolatile memory device within the storage medium 120 may perform a write operation or a read operation at a time. In an embodiment, the page may be a unit, on which a nonvolatile memory device within the storage medium 120 may access through a corresponding word line at a time. In this case, the nonvolatile memory device within the storage medium 120 may access a page through a word line corresponding to the page. In an embodiment, the page may not be limited to such unit and may correspond to another unit.

The pages within the memory blocks BLK1 to BLKi may be grouped into the memory units MU11 to MU1n. In an embodiment, the pages of relatively the same locations within the respective memory blocks BLK1 to BLKi may be grouped into the respective memory regions MR1 to MRm. In an embodiment, pages of the same address within the respective memory blocks BLK1 to BLKi may be grouped into the respective memory regions MR1 to MRm. In an embodiment, the pages corresponding to word lines of the relatively same location within the respective memory blocks BLK1 to BLKi may be grouped into the respective memory regions MR1 to MRm.

In accordance with an embodiment of the present disclosure, the memory unit may be a unit, on which the storage medium 120 may perform a write operation or a read operation at a time. In accordance with an embodiment of the present disclosure, the memory unit may not be limited to such unit and may correspond to another unit.

In accordance with an embodiment of the present disclosure, the memory region may include a single memory block, unlike the configuration of FIG. 2. In this case, the memory unit may include a single page.

Figure 3:
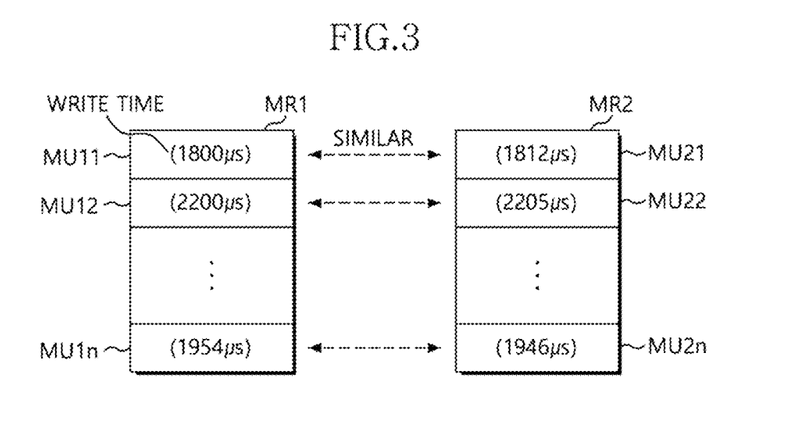
FIG. 3 is a schematic diagram illustrating the amount of time required to perform a write operation on each of memory units included in memory regions in accordance with an embodiment of the present disclosure.

FIG. 3 is a schematic diagram illustrating the amount of time required to perform a write operation on each of the memory units MU11 to MU1n and MU21 to MU2n included in the memory regions MR1 and MR2 in accordance with an embodiment of the present disclosure.

The amount of time required to perform a write operation on a memory unit may be the amount of time required to perform operations for storing data into the memory unit.

Referring to FIG. 3, memory units of relatively the same location within the different memory regions MR1 and MR2 may each take a similar amount of time to perform write operations thereon. For example, the memory units MU11 and MU21 each take about the same amount of time to perform a write operation, and the memory units MU12 and MU22 may each take a similar amount of time to perform a write operation. In this way, a memory unit in MR1 is matched to a memory unit having the same relative location in MR2, where each memory unit of a matched pair performs a write operation in approximately the same amount of time.

Therefore, when a characteristic indicative of the amount of time required to perform a write operation on a memory unit in any of the memory regions is known or determined, it may be estimated that each memory unit having relatively the same location in any other memory region takes approximately the same amount of time to perform a write operation as the memory unit for which such time is known or is determined. For example, when the location of a memory unit having requiring a small amount of time to perform a write operation is known within any of the memory regions MR1 and MR2, memory units of the same location within the other memory regions may be estimated to take approximately the same amount of time to perform respective write operations thereon.

The index of a memory unit may represent or be indicative of its assigned address, a number identifying the memory unit or any other information distinguishing that memory unit from the others. Therefore, memory units of the same index within different memory regions may take substantially the same amount of time to perform respective write operations thereon.

As described below, the target memory units TMU to be utilized for a memory dump operation within the target memory region may be determined on a basis of the amount of time required to perform a write operation, and therefore the amount of time required to perform a write operation during the memory dump operation may be effectively controlled.

Figure 4:
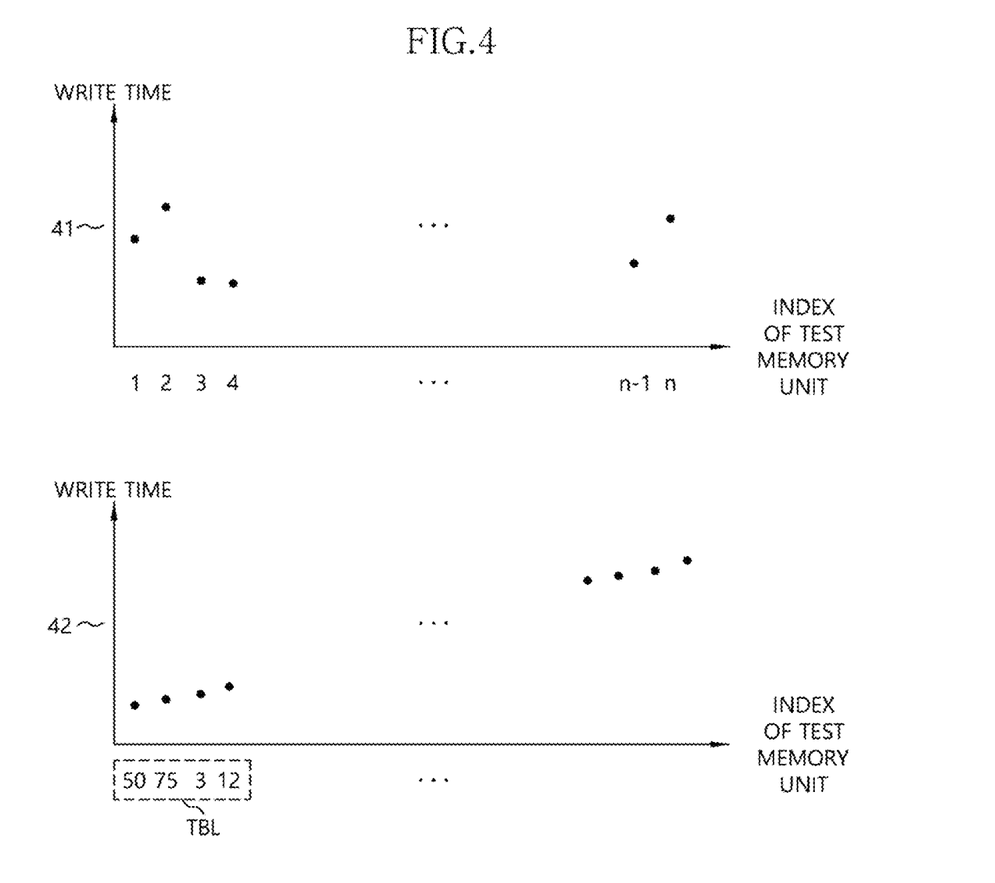
FIG. 4 is a schematic diagram illustrating a method of determining a table illustrated in FIG. 1 in accordance with an embodiment of the present disclosure.

FIG. 4 is a schematic diagram illustrating a method of determining the table TBL illustrated in FIG. 1 in accordance with an embodiment of the present disclosure.

Referring to FIG. 4, the horizontal axis of the upper graph 41 may represent indexes of the test memory units and the vertical axis of the upper graph 41 may represent the amount of time required to perform a write operation on each of the test memory units. The indexes '1' to 'n' of the horizontal axis may respectively correspond to 'n' number of the test memory units included in the test memory region. The indexes may be addresses assigned to the test memory units, numbers identifying the test memory units or other information discriminating the test memory units from one another. The amount of time required to perform a write operation on each of the test memory units, of the vertical axis, may be the amount of time required to perform operations for storing data into the test memory unit of a corresponding index.

The test memory region may be any among the memory regions MR1 to MRm within the storage medium 120. A test device or the controller 110 may perform a write operation on each of memory units (i.e., the test memory units) included in the test memory region and thus may identify the amount of time required to perform a write operation on each of the test memory units, as illustrated in the upper graph 41. As described with reference to FIG. 3, a characteristic indicative of the amount of time required to perform a write operation on a test memory unit in the test memory region may be the same as or similar to those of the other memory regions. That is, the time that any memory unit within any of the non-test memory regions takes to perform a write operation may be estimated to be substantially the same as the corresponding test memory unit (i.e., having the same index) within the test memory region. Therefore, each of the memory units in each of the non-test memory regions may be index matched with at least one memory unit in the test memory region, the common index representing that the matched memory units take substantially the same amount of time to perform a write operation.

The lower graph 42 of FIG. 4 may be a result of arranging the indexes of the test memory units in an ascending order of the amount of time required to perform write operations on the test memory units. A set number of indexes, e.g., the indexes '50', '75', '3' and '12' may be selected to configure the table TBL, the indexes '50', '75', '3' and '12' being selected in an ascending order of the amount of time required to perform write operations on the test memory units among the arranged indexes, i.e., the indexes '50', '75', '3' and '12' being selected from a top of a particular order, e.g., ascending order, of the arranged indexes.

The indexes included in the table TBL may correspond to the target memory units to be utilized for a single memory dump operation. That is, the single memory dump operation may be performed on the target memory units of the indexes '50', '75', '3' and '12' within the target memory region with reference to the table TBL.

A number of indexes selected to configure the table TBL, i.e., the number of dumps, may be determined according to storage capacity of the memory 111.

Figure 5:
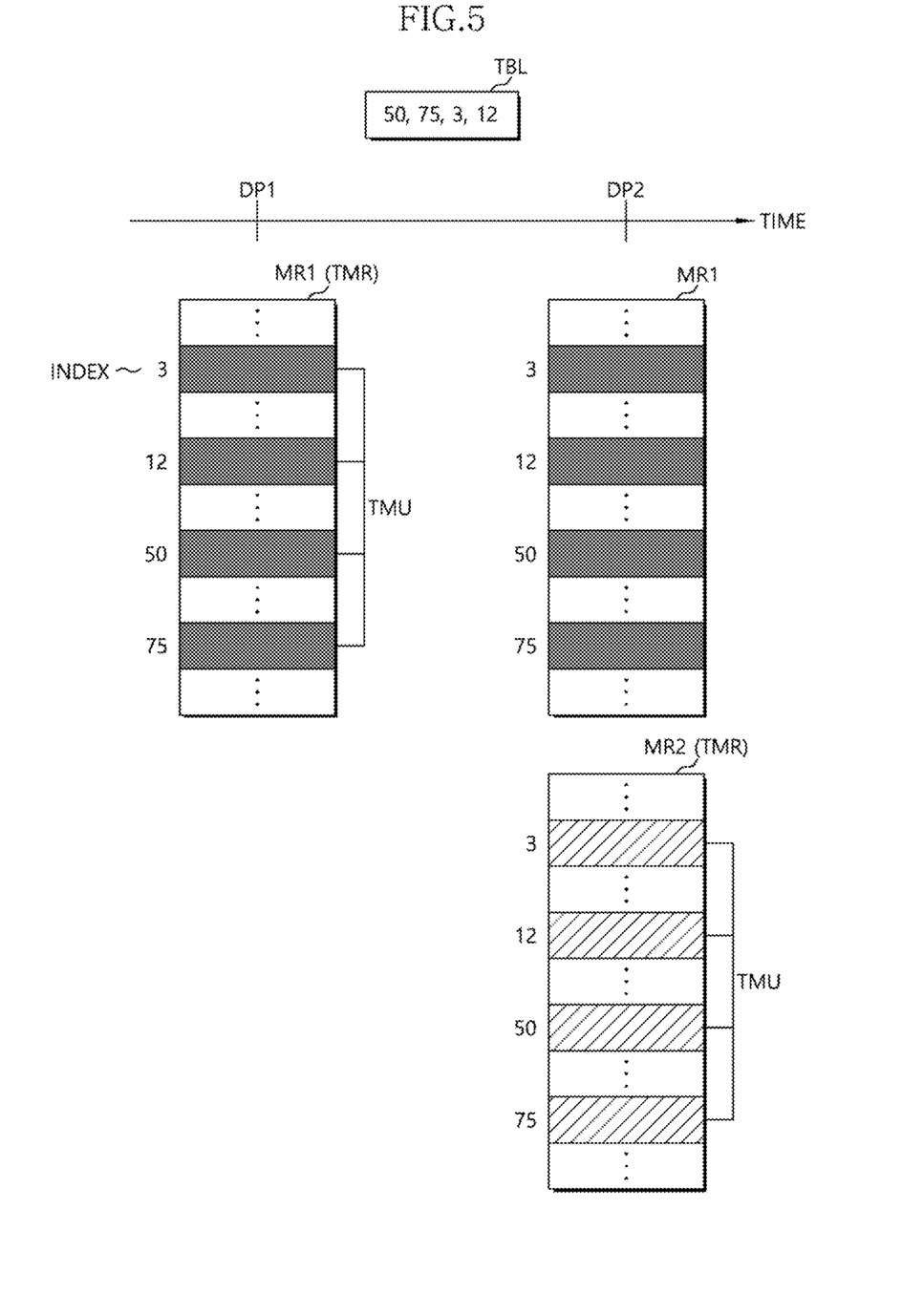
FIG. 5 is a schematic diagram illustrating a method of performing a memory dump operation by referring to a table in accordance with an embodiment of the present disclosure.

FIG. 5 is a schematic diagram illustrating a method that the controller 110 illustrated in FIG. 1 performs a memory dump operation by referring to the table TBL in accordance with an embodiment of the present disclosure. For example, the table TBL may be configured as described with reference to FIG. 4.

Referring to FIG. 5, the controller 110 may select a different target memory region TMR among the memory regions MR1 to MRm for each of memory dump operations DP1 and DP2 and may perform the respective memory dump operations DP1 and DP2 on the respectively selected target memory regions TMR. During each of the memory dump operations DP1 and DP2, the controller 110 may refer to the table TBL and may select within the corresponding target memory region TMR, as the target memory units TMU of the corresponding memory dump operation, memory units that are estimated to be able to perform respective write operations thereon in a relatively short amount of time. Within the corresponding target memory region, remaining memory units other than the target memory units TMU may not be utilized for the corresponding memory dump operation.

Particularly, when performing the memory dump operation DP1 due to a first sudden power off, the controller 110 may select the memory region MR1 as the target memory region TMR of the memory dump operation DP1. The controller 110 may perform, among the memory units included in the target memory region MR1, the memory dump operation DP1 on the target memory units TMU of the indexes '50', '75', '3' and '12' included in the table TBL. Within the memory region MR1, each of the target memory units TMU may require less time to perform a write operation thereon than each of the remaining memory units.

When performing the memory dump operation DP2 due to a second sudden power off, the controller 110 may select the memory region MR2 as the target memory region TMR of the memory dump operation DP2. The controller 110 may perform, among the memory units included in the target memory region MR2, the memory dump operation DP2 on the target memory units TMU of the indexes '50', '75', '3' and '12' included in the table TBL. Within the memory region MR2, each of the target memory units TMU may require less time to perform a write operation thereon than each of the remaining memory units.

A sequence of write operations to be performed on the target memory units TMU during each memory dump operation may be the same as the arranged order of the indexes within the table TBL.

In an embodiment, a sequence of write operations to be performed on the target memory units TMU during each memory dump operation may be independent from the arranged order of the indexes within the table TBL. For example, no matter how the indexes '50', '75', '3' and '12' are arranged within the table TBL, the sequence of write operations to be performed on the target memory units TMU during each memory dump operation may be '3', '12', '50' and '75' or any other sequence. This is because a total amount of time required to perform write operations on the target memory units TMU of the indexes included in the table TBL is substantially constant and independent from the sequence of write operations.

Due to the same reason, the indexes within the table TBL may be arranged independently from the amount of time required to perform write operations on the corresponding memory units.

In short, the controller 110 may complete a memory dump operation faster by performing the memory dump operation on the target memory units TMU, which are estimated to require less time to perform write operations thereon than other memory units within the target memory region TMR. Therefore, the performance of the memory system 100 may be improved.

Figure 6A:
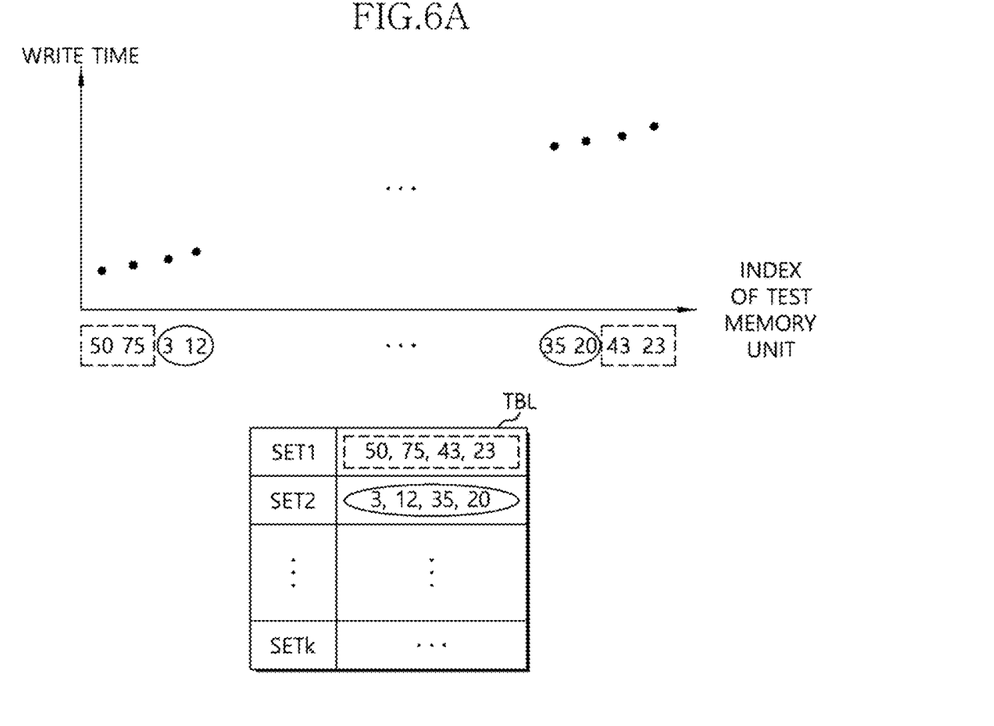
FIG. 6A is a schematic diagram illustrating a method of determining a table illustrated in FIG. 1 in accordance with an embodiment of the present disclosure.

FIG. 6A is a schematic diagram illustrating a method of determining the table TBL illustrated in FIG. 1 in accordance with an embodiment of the present disclosure.

Referring to FIG. 6A, the horizontal axis of the upper graph may represent indexes of the test memory units and the vertical axis of the upper graph may represent the time required to perform a write operation on each of the test memory units. The upper graph of FIG. 6A may be a result of arranging the indexes of the test memory units in an ascending order of the time required to perform write operations on the test memory units, which is similar to the lower graph 42 of FIG. 4.

As described above, the plurality of index sets SET1 to SETk may be generated to configure the table TBL. Each of the index sets SET1 to SETk may include the indexes of test memory units, which are different from other index sets. Each of the index sets SET1 to SETk may include a first number of the indexes selected from a top of an ascending order and a second number of the indexes selected from a bottom of such order, among the indexes arranged in ascending order of the time required to perform a write operation on a test memory unit.

For example, each of the first number and the second number may be '2'. In this case, in order to configure the first index set SET1, two indexes '50' and '75' may be selected in an ascending order of the time required to perform a write operation on a test memory unit and two indexes '43' and '23' may be selected in a descending order of the time required to perform a write operation on a test memory unit.

In order to configure the second index set SET2, two indexes '3' and '12' may be selected in an ascending order of the time required to perform a write operation on a test memory unit and two indexes '35' and '20' may be selected in a descending order of the time required to perform a write operation on a test memory unit, among remaining indexes except the indexes included in the first index set SET1.

Such method of generating the index sets may also be applied to remaining indexes except indexes included in the first index set SET1 and the second index set SET2.

The first number and the second number may be the same or different. In an embodiment, when the number of dumps is even, each of the first number and the second number may represent half of the number of dumps. In an embodiment, when the number of dumps is odd, one of the first number and the second number may be an integer closest on the low side of half the number of dumps, and the other of the two numbers may an integer closest on the high side of half.

The index sets SET1 to SETk included in the table TBL may be sequentially utilized whenever a memory dump operation is performed. That is, the indexes included in each of the index sets SET1 to SETk may be the ones of the target memory units to be utilized for a single memory dump operation.

Figure 6B:
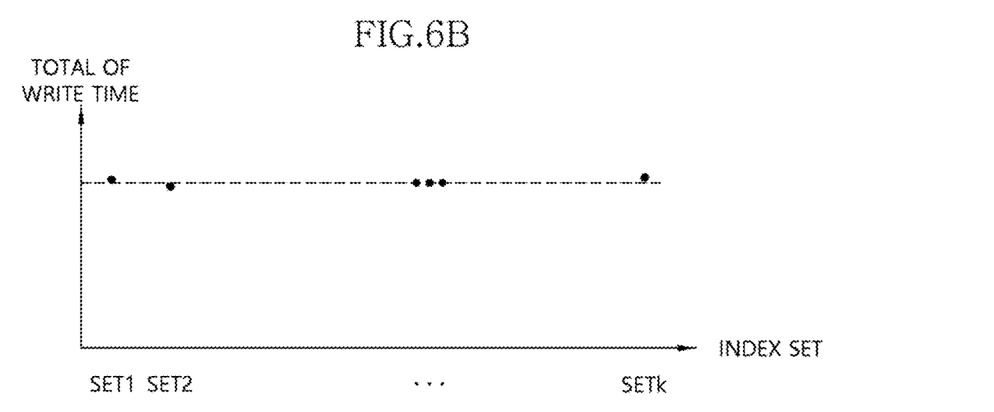
FIG. 6B is a graph illustrating a total amount of time required to perform a write operation on memory units corresponding to each index set in accordance with an embodiment of the present disclosure.

FIG. 6B is a graph illustrating a total amount of time required to perform a write operation on memory units corresponding to each index set in accordance with an embodiment of the present disclosure. Referring to FIG. 6B, the horizontal axis of the graph may represent the index sets SET1 to SETk and the vertical axis of the graph may represent a total amount of time required to perform write operations on the memory units corresponding to the indexes included in each of the index sets SET1 to SETk.

According to the method of generating the index sets SET1 to SETk described with reference to FIG. 6A, the total amount of time required to perform write operations on the memory units corresponding to the indexes included in each of the index sets SET1 to SETk may become similar to one another, as illustrated in FIG. 6B. Therefore, while memory dump operations are sequentially performed according to the index sets SET1 to SETk, variation in the total amount of time required to perform write operations on the memory units corresponding to the indexes included in each of the index sets SET1 to SETk may be insubstantial. Accordingly, the memory dump operation may be smoothly controlled and the performance of the memory system 100 may be improved.

Figure 7:
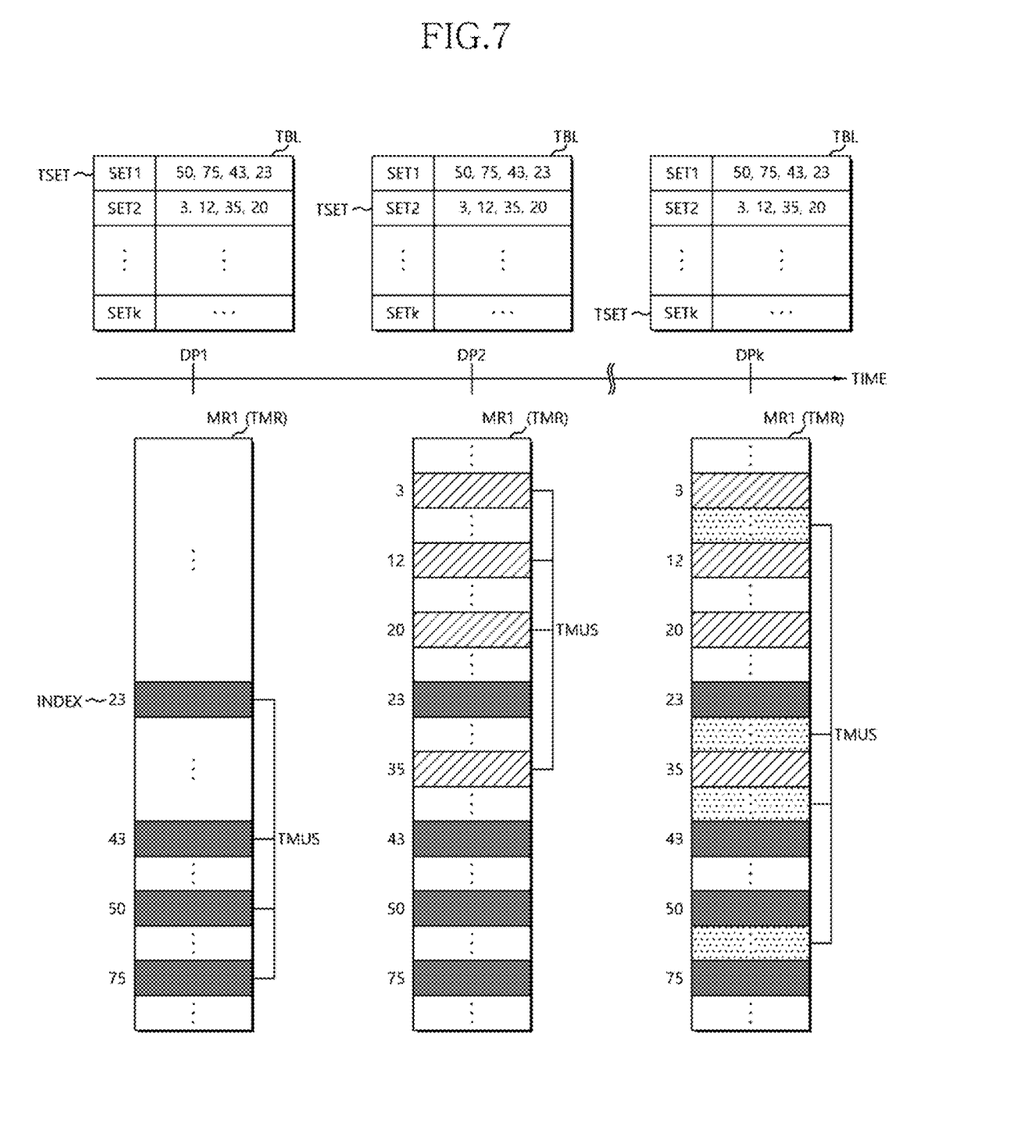
FIG. 7 is a schematic diagram illustrating a method that a controller illustrated in FIG. 1 performs a memory dump operation by referring to a table in accordance with an embodiment of the present disclosure.

FIG. 7 is a schematic diagram illustrating a method that the controller 110 illustrated in FIG. 1 performs a memory dump operation by referring to the table TBL in accordance with an embodiment of the present disclosure. For example, the table TBL may be determined as described with reference to FIG. 6A.

Referring to FIG. 7, the controller 110 may perform memory dump operations on the target memory region TMR until the target memory region TMR becomes full of dumped data, which is different from the embodiment of FIG. 5 in which the controller 110 performs each memory dump operation on some of the target memory units within the selected target memory region TMR. Whenever each memory dump operation is performed, the index sets SET1 to SETk within the table TBL may be sequentially referred to, as the target index set for the target memory region TMR.

Particularly, when performing a first memory dump operation DP1 due to a first sudden power off, the controller 110 may select the memory region MR1 as the target memory region TMR of the first memory dump operation DP1. The controller 110 may select a target memory unit set TMUS within the target memory region TMR by referring to the first index set SET1, as a target index set TSET, among the index sets SET1 to SETk and may perform the first memory dump operation DP1 on the target memory unit set TMUS. The target memory unit set TMUS of the first memory dump operation DP1 may be configured by target memory units of the indexes '50', '75', '43' and '23' within the first index set SET1.

When performing a second memory dump operation DP2 due to a second sudden power off, the controller 110 may keep (i.e., may not change) the target memory region TMR for the second memory dump operation DP2. The controller 110 may select a target memory unit set TMUS within the target memory region TMR by referring to the second index set SET2, as the target index set TSET, among the index sets SET1 to SETk and may perform the second memory dump operation DP2 on the target memory unit set TMUS. The target memory unit set TMUS of the second memory dump operation DP2 may be configured by target memory units of the indexes '3', '12', '35' and '20' within the second index set SET2.

When performing a k-th memory dump operation DPk due to a k-th sudden power off, the controller 110 may keep (i.e., may not change) the target memory region TMR for the k-th memory dump operation DPk. The controller 110 may select a target memory unit set TMUS within the target memory region TMR by referring to the k-th index set SETk, as the target index set TSET, among the index sets SET1 to SETk and may perform the k-th memory dump operation DPk on the target memory unit set TMUS. The target memory unit set TMUS of the k-th memory dump operation DPk may be configured by target memory units of the indexes within the k-th index set SETk.

Then, when a subsequent sudden power off occurs, the target memory region TMR has become full of dumped data and thus the controller 110 may select, as a new target memory region TMR, any of the memory regions MR2 to MRm of FIG. 1 and may perform memory dump operations according to the method described above.

The index sets SET1 to SETk may be sequentially utilized according to an arranged order within the table TBL whenever a memory dump operation is performed. However, as described with reference to FIG. 6B, since the total amount of time required to perform write operations on the memory units corresponding to the indexes included in each of the index sets SET1 to SETk may be similar to one another, the index sets SET1 to SETk may be arranged in the table TBL despite a sequence of generation thereof.

Figure 8:
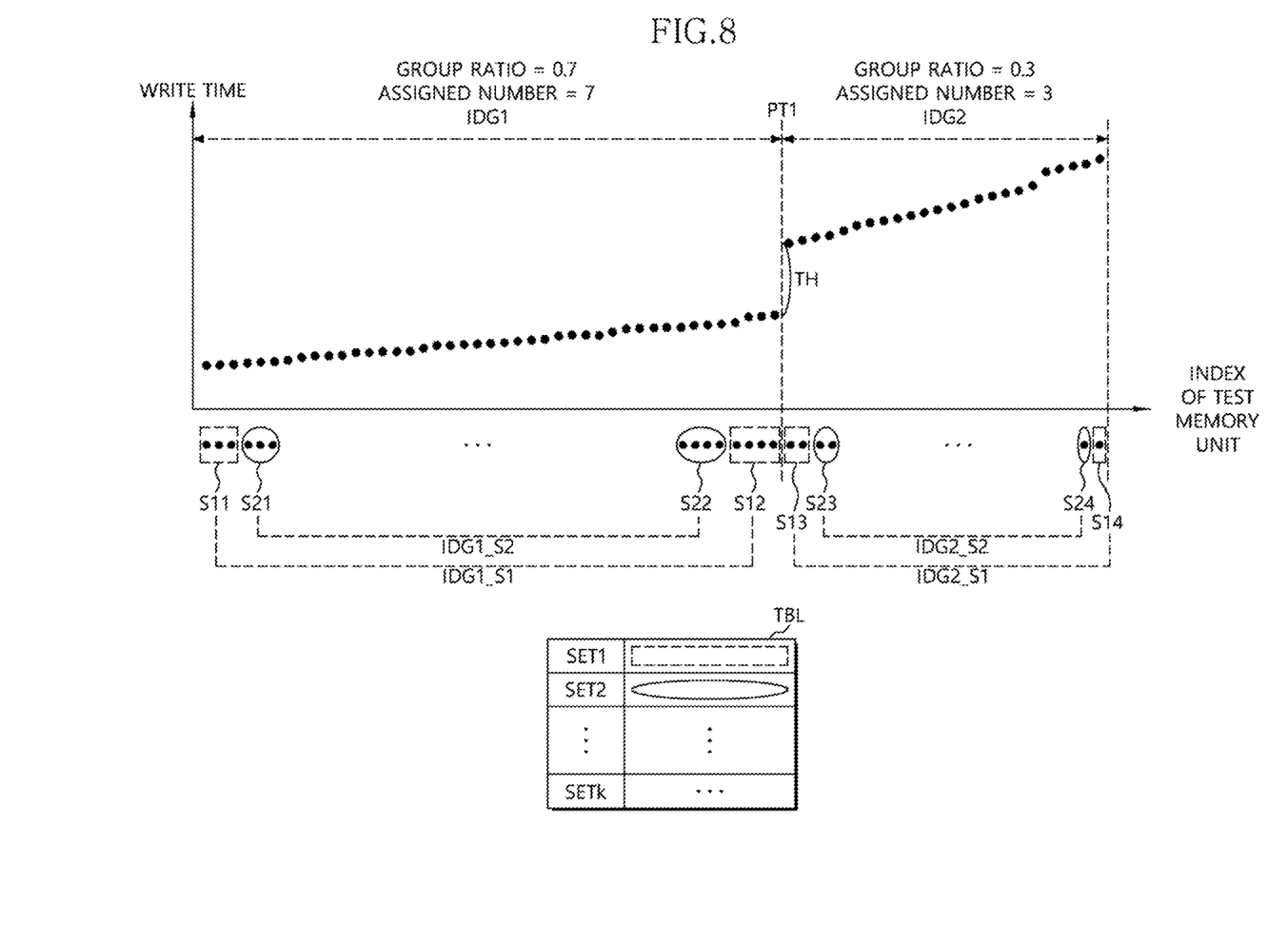
FIG. 8 is a schematic diagram illustrating a method of determining a table illustrated in FIG. 1 in accordance with an embodiment of the present disclosure.

FIG. 8 is a schematic diagram illustrating a method of determining the table TBL illustrated in FIG. 1 in accordance with an embodiment of the present disclosure.

Referring to FIG. 8, the horizontal axis of the graph may represent the indexes of the test memory units and the vertical axis of the graph may represent the amount of time required to perform a write operation on each of the test memory units. The graph of FIG. 8 may be a result of arranging the indexes of the test memory units in an ascending order of the amount of time required to perform write operations on the test memory units, which is similar to the lower graph 42 of FIG. 4.

The table TBL may include a plurality of index sets SET1 to SETk. The index sets SET1 to SETk of FIG. 8 may be generated by a different method than that by which the index sets SET1 to SETk of FIG. 6A are generated.

Particularly, when there are one or more points between the indexes, the arranged indexes may be divided into a plurality of index groups with reference to the points. An increment of the time required to perform write operations on previous and subsequent test memory units may be greater than a threshold TH. Previous and subsequent indexes respectively corresponding to the previous and subsequent test memory units may represent the point. In other words, when calculating difference in the time required to perform write operations on the previous and subsequent test memory units corresponding to the previous and subsequent indexes, respectively, and when there are points between the previous index and the subsequent index corresponding to a difference greater than the threshold TH, the arranged indexes may be divided into the index groups with reference to the points (i.e., the previous and subsequent indexes). For example, when an increment of time required to perform write operations on the previous and subsequent test memory units corresponding to the previous and subsequent indexes representing the point PT1 is greater than the threshold TH, the arranged indexes may be divided into two index groups IDG1 and IDG2 with reference to the point PT1. That is, the previous index may correspond to the greatest amount of time required to perform write operation within the index group IDG1 while the subsequent index may correspond to the smallest amount of time required to perform write operation within the index group IDG2.

Then, group ratios of the respective index groups may be calculated on the basis of a total number of the indexes included in each index group. The group ratio of each index group may be calculated by dividing a total number of the indexes included in the corresponding index group by a total number of the test memory units. For example, the group ratio of the index group IDG1 may be 0.7 and the group ratio of the index group IDG2 may be 0.3.

Then, an assigned number for each index group may be calculated on a basis of the number of dumps and the group ratio of the corresponding index group. The assigned number for each index group may be calculated by multiplying the number of dumps by the group ratio of the corresponding index group. For example, when the number of dumps is 10, the assigned number for the index group IDG1 may be 10 and the assigned number for the index group IDG2 may be 3.

Then, sub-index sets may be sequentially generated for the respective index groups, each sub-index set including the indexes as many as the assigned number for the corresponding index group. A method of sequentially generating the sub-index sets for the respective index groups, each sub-index set including the indexes as many as the assigned number for the corresponding index group, may be similar to the method of sequentially generating the index sets each including the indexes as many as the number of dumps among a total of 'n' number of indexes, as described with reference to FIG. 6A.

Particularly, the sub-index sets within the respective index groups may include a first number of the indexes selected from a top of the order and a second number of the indexes selected from a bottom of the order, among the indexes arranged in an ascending order of the time required to perform a write operation on a corresponding test memory unit within the corresponding index group.

For example, the first number may be '3' (S11) and the second number may be '4' (S12) for the index group IDG1. In order to configure a first sub-index set IDG1_S1 within the index group IDG1 in this case, 3 indexes S11 may be selected in an ascending order of the time required to perform a write operation on a test memory unit and 4 indexes S12 may be selected in a descending order of the time required to perform a write operation on a test memory unit, among the indexes within the index group IDG1. In order to configure a second sub-index set IDG1_S2 within the index group IDG1 in this case, 3 indexes S21 may be selected in an ascending order of the time required to perform a write operation on a test memory unit and 4 indexes S22 may be selected in a descending order of the time required to perform a write operation on a test memory unit, among remaining indexes except the first sub-index set IDG1_S1 within the index group IDG1. Such method of generating the sub-index sets may also be applied to remaining indexes except the first sub-index set IDG1_S1 and the second sub-index set IDG1_S2 within the index group IDG1.

For example, the first number may be '2' (S13) and the second number may be '1' (S14) for the index group IDG2. In order to configure a first sub-index set IDG2_S1 within the index group IDG2 in this case, 2 indexes S13 may be selected in an ascending order of the time required to perform a write operation on a test memory unit and 1 index S14 may be selected in a descending order of the time required to perform a write operation on a test memory unit, among the indexes within the index group IDG2. In order to configure a second sub-index set IDG2_S2 within the index group IDG2 in this case, 2 indexes S23 may be selected in an ascending order of the time required to perform a write operation on a test memory unit and 1 index S24 may be selected in a descending order of the time required to perform a write operation on a test memory unit, among remaining indexes except the first sub-index set IDG2_S1 within the index group IDG2. Such method of generating the sub-index sets may also be applied to remaining indexes within the index group IDG2.

For each index group, sum of the first number and the second number may be the same as the assigned number. In an embodiment, when the assigned number for an index group is even, each of the first number and the second number for the index group may represent half of the assigned number for the index group. In an embodiment, when the assigned number for an index group is odd, each of the first number and the second number for the index group may be an integer closest to half of the assigned number for the index group.

Then, the sub-index sets of the same order within the respective index groups may be combined into the index set of the corresponding order. For example, the first sub-index set IDG2_S1 within the index group IDG1 and the first sub-index set IDG1_S1 within the index group IDG2 may be combined into the first index set SET1. Also, the second sub-index set IDG2_S2 within the index group IDG1 and the second sub-index set IDG2_S2 within the index group IDG2 may be combined into the second index set SET2.

According to the method of generating the index sets SET1 to SETk described with reference to FIG. 8, the total time required to perform write operations on the memory units corresponding to the indexes included in each of the index sets SET1 to SETk may become similar to one another. Especially, when there is the point PT1, at which an increment of time required to perform write operations on the test memory units is greater than a threshold, the method of generating the index sets SET1 to SETk described with reference to FIG. 8 may further evenly distribute the indexes into the index sets SET1 to SETk and thus may result in a greater effect than the method of generating the index sets SET1 to SETk described with reference to FIG. 6A.

A method that the controller 110 performs a memory dump operation by referring to the table TBL of FIG. 8 may be substantially the same as the method described with reference to FIG. 7 and thus description therefor is omitted here.

Figure 9:
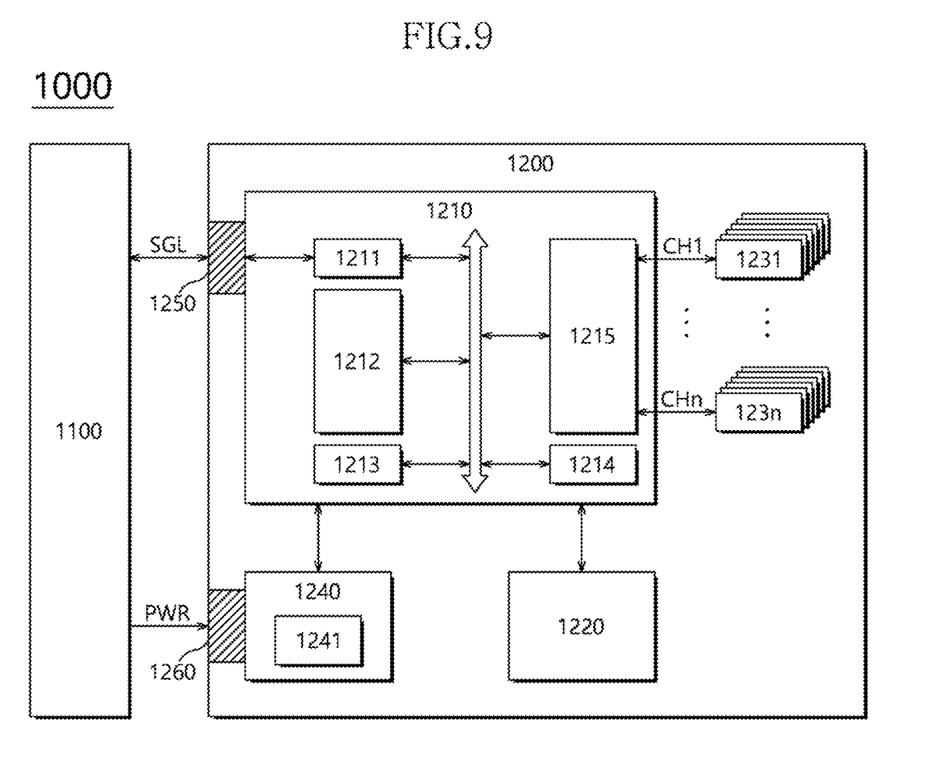
FIG. 9 is a diagram illustrating a data processing system including a solid state drive (SSD) in accordance with an embodiment.

FIG. 9 is a diagram illustrating a data processing system 1000 including a solid state drive (SSD) 1200 in accordance with an embodiment. Referring to FIG. 9, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may operate in the same manner as the controller 110 shown in FIG. 1.

The controller 1210 may include a host interface 1211, a control component 1212, a random access memory 1213, an error correction code (ECC) component 1214, and a memory interface 1215.

The host interface 1211 may exchange a signal SGL with the host device 1100 through the signal connector 1250. The signal SGL may include a command, an address, data, and the like. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control component 1212 may analyze and process the signal SGL received from the host device 1100. The control component 1212 may control operations of internal function blocks according to firmware or software for driving the SSD 1200. The random access memory 1213 may be used as a working memory for driving such firmware or software. The random access memory 1213 may correspond to the memory 111 shown in FIG. 1.

The ECC component 1214 may generate the parity data of data to be transmitted to at least one of the nonvolatile memory devices 1231 to 123n. The generated parity data may be stored together with the data in the nonvolatile memory devices 1231 to 123n. The ECC component 1214 may detect an error of the data read from at least one of the nonvolatile memory devices 1231 to 123n, based on the parity data. If a detected error is within a correctable range, the ECC component 1214 may correct the detected error.

The memory interface 1215 may provide control signals such as commands and addresses to at least one of the nonvolatile memory devices 1231 to 123n, according to control of the control component 1212. Moreover, the memory interface 1215 may exchange data with at least one of the nonvolatile memory devices 1231 to 123n, according to control of the control component 1212. For example, the memory interface 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to the same channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be properly terminated when a sudden power-off occurs. The auxiliary power supply 1241 may include large capacity capacitors.

The signal connector 1250 may be configured by any of various types of connectors depending on an interface scheme between the host device 1100 and the SSD 1200.

The power connector 1260 may be configured by any of various types of connectors depending on a power supply scheme of the host device 1100.

Figure 10:
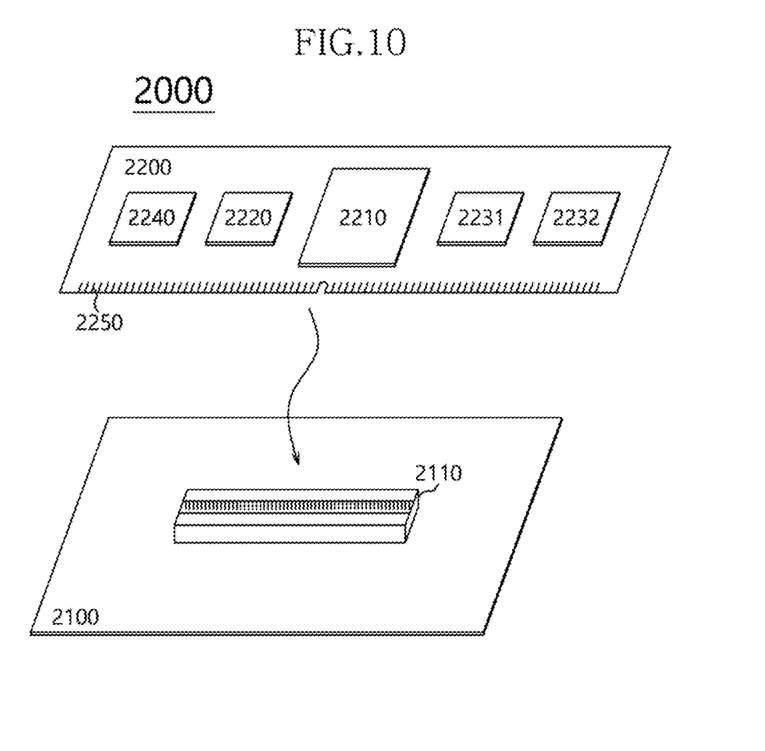
FIG. 10 is a diagram illustrating a data processing system including a memory system in accordance with an embodiment.

FIG. 10 is a diagram illustrating a data processing system 2000 including a memory system 2200 in accordance with an embodiment. Referring to FIG. 10, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 110 shown in FIG. 1 or the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured as any of various types depending on an interface scheme between the host device 2100 and the memory system 2200. The connection terminal 2250 may be disposed on or in any side of the memory system 2200.

Figure 11:
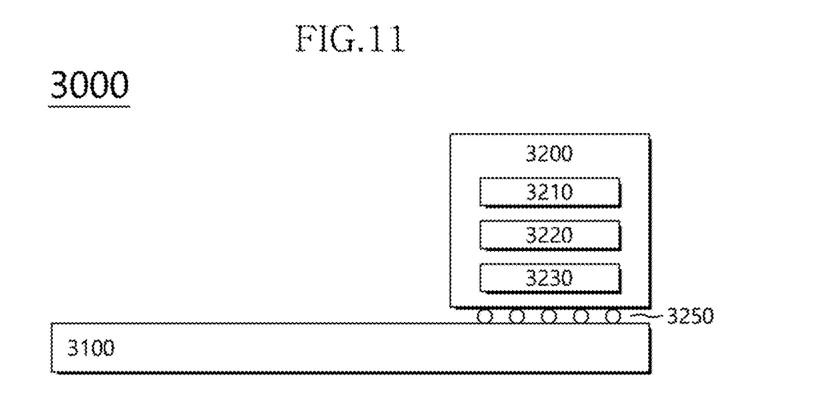
FIG. 11 is a diagram illustrating a data processing system including a memory system in accordance with an embodiment.

FIG. 11 is a diagram illustrating a data processing system 3000 including a memory system 3200 in accordance with an embodiment. Referring to FIG. 11, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 110 shown in FIG. 1 or the controller 1210 shown in FIG. 9.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
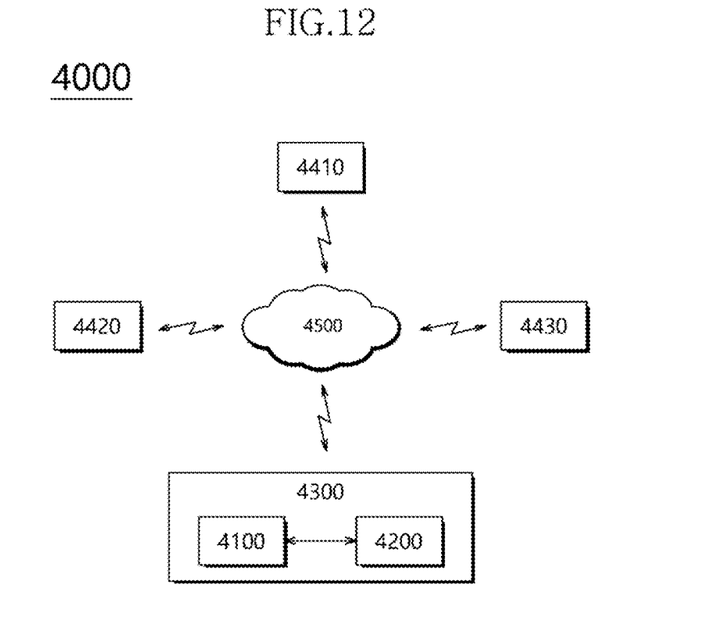
FIG. 12 is a diagram illustrating a network system including a memory system in accordance with an embodiment.

FIG. 12 is a diagram illustrating a network system 4000 including a memory system 4200 in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 1200 shown in FIG. 9, the memory system 2200 shown in FIG. 10 or the memory system 3200 shown in FIG. 11.

Figure 13:
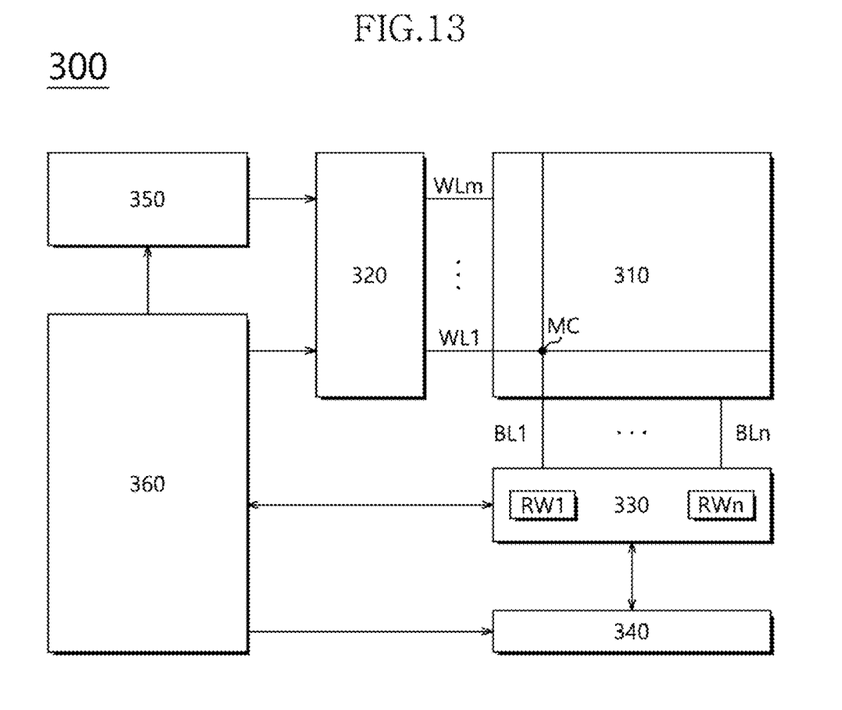
FIG. 13 is a block diagram illustrating a nonvolatile memory device included in a memory system in accordance with an embodiment.

FIG. 13 is a block diagram illustrating a nonvolatile memory device 300 included in a memory system in accordance with an embodiment. Referring to FIG. 13, the nonvolatile memory device 300 may include a memory cell array 310, a row decoder 320, a data read/write block 330, a column decoder 340, a voltage generator 350, and control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While certain embodiments have been illustrated and described, it will be understood to those skilled in the art that the embodiments described are by way of example only. Accordingly, the present invention is not limited by or to any of the described embodiments. Rather, the present invention encompasses all modifications and variations of any of the disclosed embodiments that fall within the scope of the claims.

What is claimed is:

1. A memory system comprising:
a storage medium including a first target memory region having a plurality of first memory units and a second target memory region having a plurality of second memory units, the second target memory region being different from the first target memory region; and
a controller configured to perform a first memory dump operation on one or more first target memory units having the same indexes as indexes included in a table among the plurality of first memory units in response to a first sudden power off, and perform a second memory dump operation on one or more second target memory units having the same indexes as the indexes included in the table among the plurality of second memory units in response to a second sudden power off.

2. The memory system of claim 1,
wherein the storage medium further includes a test memory region including test memory units,
and
wherein the indexes included in the table are information of one or more test memory units, among the test memory units, in an ascending order of an amount of time required for the corresponding test memory unit to perform a write operation.

3. The memory system of claim 1, wherein each of the plurality of first memory units has the same or similar characteristics, as to the amount of time required to perform a write operation thereon, as a second memory unit having the same index among the plurality of second memory units.

4. The memory system of claim 1,
wherein the storage medium includes a plurality of memory regions, and
wherein the controller is configured to select new target memory units within a new target memory region among the plurality of memory regions each time a memory dump operation is performed.

5. A memory system comprising:
a storage medium including a target memory region having a plurality of memory units; and
a controller configured to manage a table including index sets, the index sets including a first index set including first indexes and a second index set including second indexes, the second index set being different from the first index set,
wherein the controller performs a first memory dump operation on first memory units having the same indexes as the first indexes among the plurality of memory units in response to a first sudden power off, and performs a second memory dump operation on second memory units having the same indexes as the second indexes among the plurality of memory units in response to a second sudden power off, and
wherein the first index set and the second index set are generated such that a total amount of time required to perform the first memory dump operation is the same as or similar to a total amount of time required to perform the second memory dump operation.

6. The memory system of claim 5,
wherein the storage medium further includes a test memory region including test memory units, and
wherein each of the index sets includes indexes of the test memory units, which are different from other index sets.

7. The memory system of claim 6, wherein the controller generates the index sets by:
arranging indexes of the test memory units in an ascending order of the amount of time required to perform a write operation on each of the test memory units; and
sequentially generating the index sets such that each of the index sets sequentially includes a first number of the indexes selected from a top of the ascending order and a second number of the indexes selected from a bottom of the ascending order, among the arranged indexes.

8. The memory system of claim 7,
wherein each of the first number and the second number represents half of a number of dumps or is an integer closest to the half, and
wherein the number of dumps is a number of memory units required to perform the memory dump operation.

9. The memory system of claim 6, wherein the controller generates the index sets by:
arranging indexes of the test memory units in an ascending order of the amount of time required to perform a write operation on each of the test memory units;
dividing the arranged indexes into index groups with reference to one or more points between the arranged indexes, an increment of the amount of time required to perform write operations on a test memory unit on one side of each point and a test memory unit on the other side of the corresponding point being greater than a threshold amount;
calculating a group ratio of each of the index groups based on a total number of the indexes included in each index group;
calculating an assigned number for each index group based on a number of dumps and the group ratio;
sequentially generating sub-index sets for the respective index groups, each sub-index set including the indexes as many as the assigned number for the corresponding index group; and
combining the sub-index sets of the same order within the respective index groups into an index set of a corresponding order.

10. The memory system of claim 9, wherein each of the sub-index sets sequentially generated within each index group sequentially includes a first number of the indexes selected from a top and a second number of the indexes selected from a bottom, among the indexes arranged in the ascending order of the amount of time required to perform a write operation on a corresponding test memory unit within a corresponding index group.

11. The memory system of claim 10, wherein each of the first number and the second number represents half of the assigned number or is an integer closest to the half.

12. The memory system of claim 6, wherein each of the test memory units has the same or similar characteristic to a memory unit having the same index among the memory units as to the amount of time required to perform a write operation thereon.

13. The memory system of claim 5, wherein the controller utilizes the target memory region until the target memory region is full of dumped data by sequentially selecting one among the index sets at each memory dump operation.

* * * * *